US010615641B2

(12) United States Patent
Ellis et al.

(10) Patent No.: US 10,615,641 B2
(45) Date of Patent: Apr. 7, 2020

(54) INDUCTION POWERED ELECTRICITY CURRENT MONITORING

(71) Applicant: Vutiliti, Inc., Sandy, UT (US)

(72) Inventors: Stephen K. Ellis, Saratoga Springs, UT (US); Kody S. Brown, West Jordan, UT (US)

(73) Assignee: Vutiliti, Inc., Sandy, UT (US)

( * ) Notice: Subject to any disclaimer, the term of this patent is extended or adjusted under 35 U.S.C. 154(b) by 93 days.

(21) Appl. No.: 15/936,225

(22) Filed: Mar. 26, 2018

(65) Prior Publication Data

US 2018/0375377 A1   Dec. 27, 2018

Related U.S. Application Data

(60) Provisional application No. 62/525,116, filed on Jun. 26, 2017.

(51) Int. Cl.
*H02J 50/10* (2016.01)
*G01R 15/18* (2006.01)
*H02J 7/00* (2006.01)

(52) U.S. Cl.
CPC .............. *H02J 50/10* (2016.02); *G01R 15/18* (2013.01); *H02J 2007/005* (2013.01)

(58) Field of Classification Search
CPC .... H02J 50/10; H02J 2007/005; H02J 7/0078; H02J 13/0075; G01R 15/18; G01R 31/385; G01R 11/63; G01N 22/02; G01N 15/10

(Continued)

(56) References Cited

U.S. PATENT DOCUMENTS 5,892,430 A    4/1999  Wiesman et al.
6,018,239 A    1/2000  Berkcan et al.
(Continued)

FOREIGN PATENT DOCUMENTS

CA    2880129 A    7/2015
EP    2116854 A1   11/2009
WO    2019005626   1/2019

OTHER PUBLICATIONS

3 Phase Wireless EnOcean CT Clamp, https://web.archive.org/web/20170523005233/http://www.pressac.com:80/3-phase-current-transducer-enocean-ct-clamp, May 23, 2017.

(Continued)

*Primary Examiner* — Melissa J Koval
*Assistant Examiner* — Trung Nguyen
(74) *Attorney, Agent, or Firm* — Stoel Rives LLP; R. Whitney Johnson

(57) ABSTRACT

Induction powered electrical current monitoring, and related devices, apparatuses, systems, and methods are disclosed. An electricity current monitoring device can include an inductive energy transfer medium, an energy storage device, a power management circuit, and a processing circuit. The inductive energy transfer medium can induce an electromotive force to produce electrical energy that can be stored in the energy storage device. A power management circuit can control storage of the electrical energy in the energy storage device and can control release of the electrical energy from the energy storage device. The processing circuit can measure the electrical current in the monitored energy source based on the fluctuating magnetic field generated by the inductive energy transfer medium. The processing circuit is electrically coupled to the power management circuit to be powered using the electrical energy released from the energy storage device.

20 Claims, 6 Drawing Sheets

(58) Field of Classification Search
USPC ... 324/76.11, 76.66, 96, 126, 500, 501, 600, 324/639, 642, 702, 425, 427, 519, 750.17, 324/754.28, 548, 658

See application file for complete search history.

(56) References Cited

U.S. PATENT DOCUMENTS

| | | |
|---|---|---|
| 6,624,721 B1 | 9/2003 | Hagen et al. |
| 6,714,000 B2 | 3/2004 | Staats |
| 7,145,322 B2 | 12/2006 | Solveson et al. |
| 7,369,045 B2 | 5/2008 | Hansen |
| 7,667,482 B2 | 2/2010 | Mort et al. |
| 8,421,588 B1 | 4/2013 | Ross et al. |
| 9,335,352 B2 | 5/2016 | McCrea et al. |
| 9,397,484 B2 | 7/2016 | Woodbury |
| 9,455,767 B2 | 9/2016 | Klapper |
| 2003/0201873 A1 | 10/2003 | Cern |
| 2008/0007416 A1 | 1/2008 | Cern |
| 2008/0077336 A1 | 3/2008 | Fernandes |
| 2008/0147335 A1* | 6/2008 | Adest ............ G01D 4/004 702/64 |
| 2008/0315971 A1 | 12/2008 | Radtke |
| 2010/0084920 A1* | 4/2010 | Banting ............ G01R 15/142 307/66 |
| 2010/0207712 A1* | 8/2010 | Braune ............ H01H 71/04 335/17 |
| 2012/0268106 A1 | 10/2012 | Blake, Jr. et al. |
| 2014/0266784 A1* | 9/2014 | Ratcliff ............ G01D 4/004 340/870.03 |
| 2016/0116505 A1 | 4/2016 | Kast et al. |
| 2017/0206781 A1 | 7/2017 | Miller et al. |

OTHER PUBLICATIONS

Alpha Omega 742 Sensors Wireless, http://www.alphaomega-electronics.com/en/742-sensores-wireless-corriente-ac, Aug. 14, 2016.

Wireless Single Phase CT Clamp V1, https://web.archive.org/web/20170802162315/http://www.pressac.com/current-transducer-enocean-ct-clamp, Aug. 2, 2017.

Han, J. et al., ""A Nonintrusive Power Supply Design for Self-Powered Sensor Networks in the Smart Grid by Scavenging Energy From AC Power Line,"", in IEEE Transactions on Industrial Electronics, vol. 62, No. 7, pp. 4398-4407, Jul. 2015.

Hu, Y. et al., ""Self-powered system with wireless data transmission"", Nano Letters, http://europepmc.org/abstract/med/21604749, May 23, 2011 Jun;11(6) 2572-2577.

Lu, B. et al., ""Online and Remote Motor Energy Monitoring and Fault Diagnostics Using Wireless Sensor Networks,"", in IEEE Transactions on Industrial Electronics, vol. 56, No. 11, pp. 4651-4659, Nov. 2009.

Moghe, R. et al., ""Design of a low cost self powered "Stick-on" current and temperature wireless sensor for utility assets,"", 2010 IEEE Energy Conversion Congress and Exposition, Atlanta, GA, 2010, pp. 4453-4460.

Roscoe, N. et al., ""Harvesting Energy From Magnetic Fields to Power Condition Monitoring Sensors,"", in IEEE Sensors Journal, vol. 13, No. 6, pp. 2263-2270, Jun. 2013.

International Search Report and Written Opinion dated Sep. 14, 2018 for international application PCT/US2018/039101.

\* cited by examiner

INDUCTION POWERED ELECTRICITY CURRENT MONITORING

CROSS-REFERENCE TO RELATED APPLICATIONS

This application claims the benefit of U.S. Provisional Application No. 62/525,116, filed Jun. 26, 2017, titled "INDUCTION POWERED ELECTRICITY CURRENT MONITORING," which is hereby incorporated herein by reference in its entirety.

TECHNICAL FIELD

The present disclosure relates to monitoring electricity current, and more particularly to induction powered electricity current monitoring.

BRIEF DESCRIPTION OF THE DRAWINGS

Additional aspects and advantages will be apparent from the following detailed description of preferred embodiments, which proceeds with reference to the accompanying drawings, in which.

DETAILED DESCRIPTION

Remote monitoring of electricity can be challenging as typical monitoring devices require power to operate and/or to communicate measurements to a remote location. Moreover, presently available current monitoring devices must be powered to provide monitoring or measuring.

The present disclosure provides for induction powered electricity current monitoring, and related devices, apparatuses, and methods. Certain embodiments disclosed herein harvest power by induction from a monitored energy source (e.g., a wire), store the harvested power in an energy storage device, and then release stored energy to power a processing circuit. The processing circuit may take a real-time sample or measurement from which to infer electrical activity within the monitored energy source. The released energy can further power the processing circuit to transmit and/or receive information.

By harvesting power through induction, disclosed embodiments can be more easily deployed in remote locations, or any location, without concern for access to a separate power source or connection.

The present disclosure will be better understood from the detailed description provided below and from the drawings of various embodiments, methods, and examples herein. These specifics, however, are provided for explanatory purposes that help the various embodiments of the disclosure to be better understood. The invention should therefore not be limited by the described embodiments, methods, and examples, but by all embodiments and methods within the scope and spirit of the invention as claimed.

Figure 1:
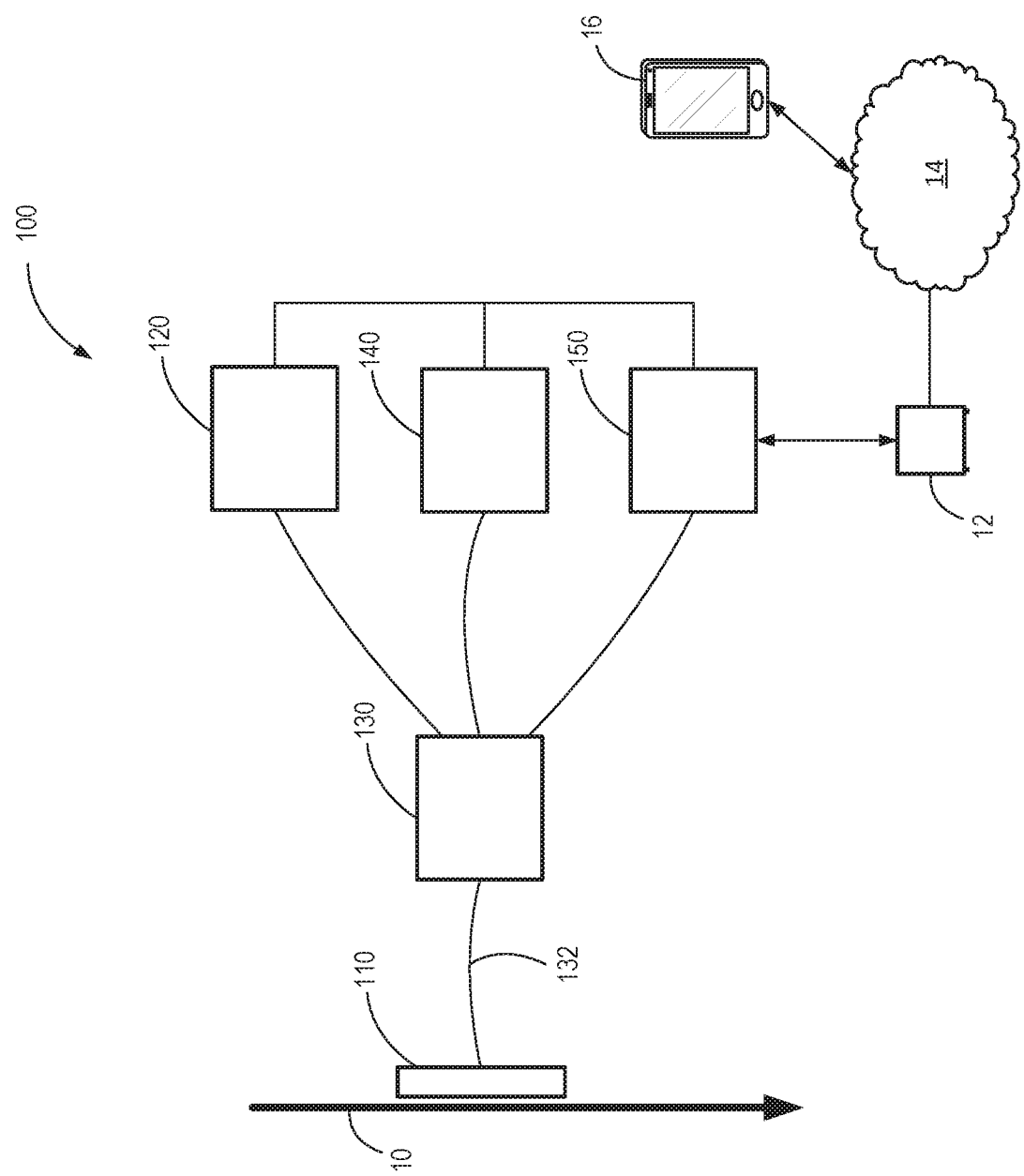
FIG. 1 is an electricity current monitoring device, according to one embodiment of the present disclosure.

FIG. 1 is an electricity current monitoring device 100, according to one embodiment of the present disclosure. The electricity current monitoring device 100 includes an inductive energy transfer electrical component 110, an energy storage device 120, delivery circuitry 130, power management circuitry 140, and processing circuitry 150. The electricity current monitoring device 100 is inductively powered and can monitor electricity current in a first electrical conductor 10 (e.g., a monitored energy source). The first electrical conductor 10 may be a wire, such as in a three-phase power line to a building. In other embodiments, the first electrical conductor 10 may be a conductive panel.

The inductive energy transfer electrical component 110 may be a current transformer. In another embodiment, the inductive energy transfer electrical component 110 may be an inductive frequency panel (e.g., compatible with Qi, an open interface standard developed by the Wireless Power Consortium for inductive charging over distances). The inductive energy transfer electrical component 110 can produce a fluctuating magnetic field from a fluctuating flow of electrical current in the first electrical conductor 10.

In some embodiments, the fluctuating flow of electrical current in the first electrical conductor 10 may be alternating current (AC). In other embodiments, the fluctuating flow of electrical current in the first electrical conductor 10 is direct current (DC).

The fluctuating magnetic field can induce an electromotive force within a second electrical conductor 132 to produce electrical energy. The second electrical conductor 132 may be a coil or a wire that is electrically coupled to or included in the delivery circuitry 130. The second electrical conductor 132 is electrically coupled to the inductive energy transfer electrical component 110.

The delivery circuitry 130 can provide electrical coupling from the second electrical conductor 132 to the energy storage device 120 and/or the processing circuitry 150. The delivery circuitry 130 can control or direct delivery of electric current to either the energy storage device 120 or to the processing circuitry 150. In other words, the fluctuating magnetic field produced by the inductive energy transfer electrical component 110 in turn induces the electromotive force in the delivery circuitry 130 to provide electric current for delivery of electrical energy to the energy storage device 120.

In one embodiment, the delivery circuitry 130 may include a gate to be switched by the power management circuitry 140. For example, the power management circuitry 140 may direct (e.g., provide a signal to) the gate of the delivery circuitry 130 to direct storage of electrical energy in the energy storage device 120. The power management circuitry 140 may direct the delivery circuitry 130 to transition (e.g., switch) to delivery of electric current to the processing circuitry 150, upon the energy storage device 120 releasing electrical energy to the processing circuitry 150.

The energy storage device 120 can store the electrical energy produced by the induced electromotive force. In other embodiments, the energy storage device 120 may be any device capable of storing energy, whether electrical, mechanical, or a combination thereof. In one embodiment, the energy storage device 120 may be a battery. In another embodiment, the energy storage device 120 may be a capacitor. The energy storage device 120 may store a quantity of energy that can be represented by a constant, or otherwise understood to be a fixed or predictable amount.

The energy storage device 120 may be electrically coupled to and receive electric current from the delivery circuitry 130 to store as energy. The energy storage device 120, upon reaching a threshold level of energy storage, may release stored energy to the processing circuitry 150.

The power management circuitry 140 may control or otherwise direct storage of the electrical energy in the energy storage device 120. For example, the power management circuitry 140 may direct (e.g., provide a signal to) a gate of the delivery circuitry 130 to direct storage of electrical energy in the energy storage device 120. In some embodiments, the power management circuitry 140 may also control or otherwise direct a release of the electrical energy from the energy storage device 120. In some embodiments, the power management circuitry 140 may also direct the gate of the delivery circuitry 130 to transition (e.g., switch) to delivery of electric current to the processing circuitry 150.

In one embodiment, the power management circuitry 140 may include a relay that electromechanically or electronically opens and closes an electrical circuit of one or both of the power management circuitry 140 and the processing circuitry 150. For example, the relay may close at or in response to a release of energy from the energy storage device 120. The relay closing may cause an electrical signal to direct a gate of the delivery circuitry 130 to direct electric current to the processing circuitry 150. The relay may open at or in response to a stoppage of energy release to the processing circuitry 150. The relay opening may cause an electrical signal to direct the gate of the delivery circuitry 130 to direct electric current to the energy storage device 120. Stated otherwise, the relay, in a first position, closes the power management circuitry 140 and opens the processing circuitry 150 and, in a second position, opens the power management circuitry 140 and closes the processing circuitry 150.

The processing circuitry 150, in one embodiment, can in real-time detect and/or measure electrical current in the first electrical conductor 10. For example, the processing circuitry 150 may take a real-time sample or reading to measure electric current in the first electrical conductor 10 based on induction, voltage, and/or current in the delivery circuitry 130. As stated earlier, the processing circuitry 150 may be powered by the energy released from the energy storage device 120. The processing circuitry 150 may be electrically coupled to the power management circuitry 140 to receive a release of energy from the energy storage device 120.

The processing circuitry 150 may include one or more general purpose devices, such as a standard microprocessor. The processing circuitry 150 may include a special purpose processing device, or other customized or programmable device. The processing circuitry 150 may run a standard operating system and perform standard operating system functions.

The processing circuitry 150 may include a network interface and/or wireless network interface to facilitate communication with other computing devices and/or networks, such as the Internet and/or other computing and/or communications networks.

The processing circuitry 150 may transmit information to another computing device 12 and/or a network 14 (e.g., the Internet). In some embodiments, the transmission may be by wireless protocol via a wireless technology. The transmission may include data indicating a measurement taken of the current in the first electrical conductor 10. In this manner, current in the first electrical conductor 10 can be monitored and/or measured remotely (e.g., from a remote operation center). Further, the measurements of the current can be processed remotely from the first electrical conductor 10. Data concerning the current in the first electrical conductor 10 can also be presented to a remote user, such as via an application on a mobile device 16. In other embodiments, the data may be presented via other user interfaces, including but not limited to a web interface, a compiled program, a downloadable spreadsheets, APIs, on-board screens, sounds, alerts, notifications, and the like.

The processing circuitry 150 may also receive a transmission of information, such as from the network 14 and/or the other computing device 12. The transmission may include instructions, software and/or firmware updates, settings, and the like.

As can be appreciated, in other embodiments, the processing circuitry 150 may include any variety of a consumptive circuit (e.g., consumptive of energy) that performs operations to accomplish a variety of functions in addition to or other than detection and/or measurement of current in the first electrical conductor 10 (or monitored energy source). For example, the processing circuitry 150 may detect or measure a voltage across an electrical conductor or portion thereof. The processing circuitry 150 may simply provide a transmission of data. The processing circuitry 150, in some embodiments, may gather voltage and/or current data for more than one monitored energy source at a time. In another embodiment, the processing circuitry 150 can infer from the elapsed time during an off-state how much current was consumed and for how long. This may be accomplished by knowing the amount of current (through the electrical conductor) to charge the energy storage system 120, and obtaining timestamps of the last read and the immediate activation timestamp. As a result, the processing circuitry 150 can draw an inference as to how much time elapsed to consume the requisite base current load on the first electrical conductor 10 (or monitored energy source) between reads. In other words, the current monitoring device 100 may evaluate energy while in an off-state by considering that the system requires x energy to power up again, therefore enabling deduction (e.g., given timestamps of last measure and next measure) that a known energy amount occurred while the monitoring device 100 was charging. The current monitoring device 100 may provide both real-time reading (while the monitoring device 100, and specifically the processing circuitry 150, is powered), and accumulated data (while the monitoring device 100 is charging).

In other embodiments, processing functionality provided by the processing circuitry 150 may be performed by the other computing device 12, or some other remote computing device (e.g., a current monitoring hub or other computing device such as in a cloud computing environment).

Upon completion of desired operations, the processing circuitry 150 may dump off any remaining energy stored in the energy storage device 120, so as to ensure a known quantity of energy is stored in the energy storage device 120 for consideration during a subsequent cycle of the processing circuitry 150. The processing circuitry 150 may dump off energy by lighting a light emitting diode (LED), by powering a separate radio, beacon (e.g., a longer Bluetooth beacon), processing platform, or other use of the relocated energy surplus. As long as the energy is drawn out of the energy storage device 120, this surplus energy can be used as desired.

Figure 2:
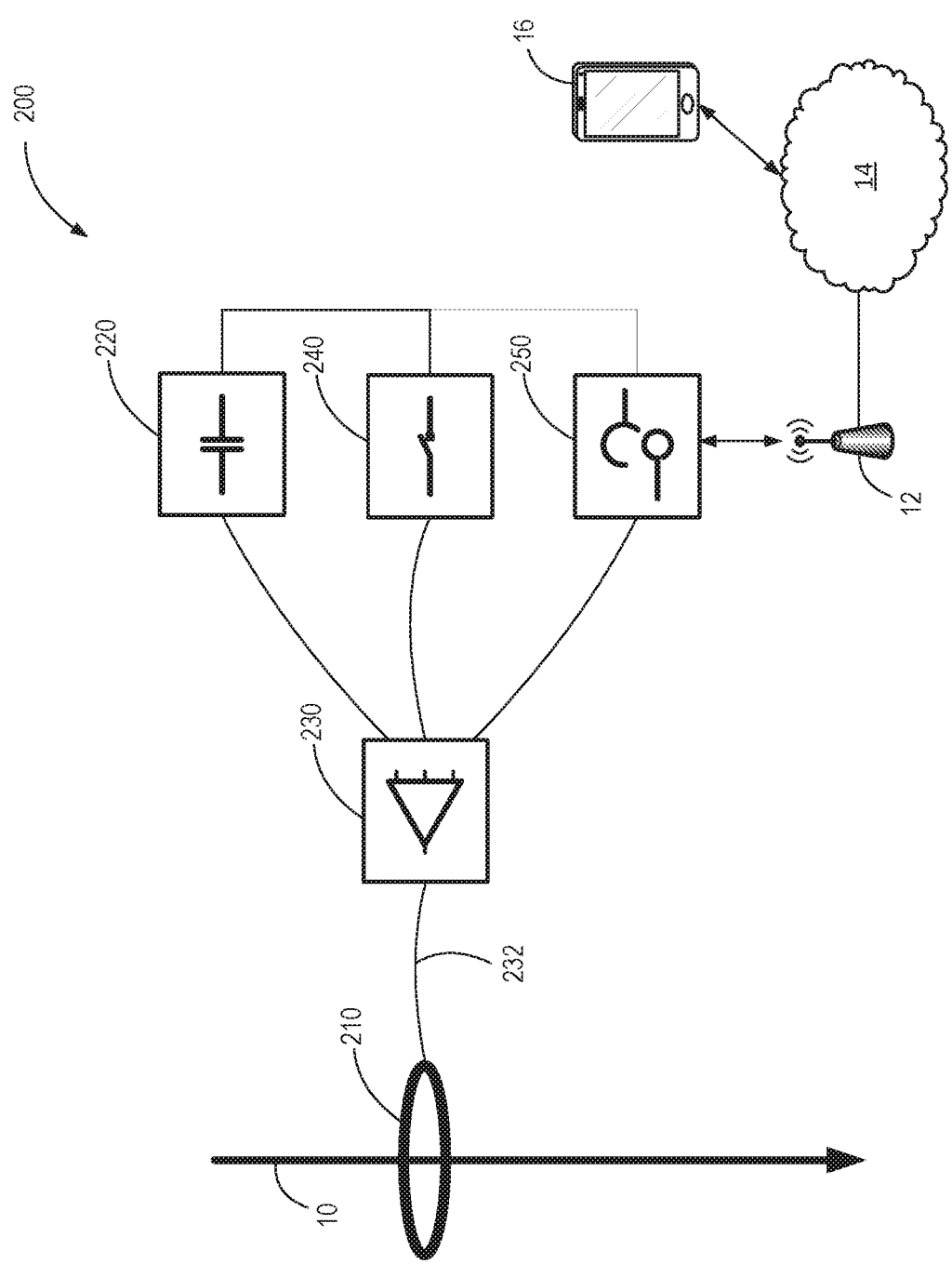
FIG. 2 is an electricity current monitoring device, according to another embodiment of the present disclosure.

FIG. 2 is diagram of an electricity current monitoring device 200, according to another embodiment of the present disclosure. The electricity current monitoring device 200 of FIG. 2 may resemble the electricity current monitoring device 100 described above with respect to FIG. 1. Accordingly, like features may be designated with like reference numerals, with the leading digits incremented to "2." Relevant disclosure set forth above regarding similarly identified features thus may not be repeated hereafter. Moreover, specific features of the electricity current monitoring device 200 may not be shown or identified by a reference numeral in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the electricity current monitoring device 200. Any suitable combination of the features and variations of the same described with respect to the electricity current monitoring device 100 can be employed with the electricity current monitoring device 200, and vice versa. This pattern of disclosure applies equally to further embodiments depicted in subsequent figures and described hereafter.

FIG. 2 is an electricity current monitoring device 200 that is inductively powered by an inductive loop around a monitored energy source 10 that is a wire. The electricity current monitoring device 200 includes a current transformer 210, a capacitor 220 to store electrical energy, a delivery circuit 230, a power management circuit 240, and an analysis circuit 250. The electricity current monitoring device 200 is inductively powered and can monitor electricity current in the monitored energy source 10 (e.g., a first wire of a three-phase power supply or other electrical conductor).

The current transformer 210 may, in one embodiment, be a CT clamp (or current transformer clamp, having a split core to allow the current transformer 210 to be clipped around or otherwise clamped or interfaced to the monitored energy source 10. The current transformer 210 can conduct a fluctuating magnetic field from a fluctuating flow of electrical current in the monitored energy source 10. In some embodiments, the fluctuating flow of electrical current in the monitored energy source 10 may be alternating current (AC) within a wire. In other embodiments, the fluctuating flow of electrical current in the monitored energy source 10 may be direct current (DC), with a fluctuating flow (e.g., a fluctuating intensity or rate), within the monitored energy source 10.

The fluctuating magnetic field within the current transformer 210 can in turn conduct an electromotive force within a second wire 232 to produce electrical energy. The wire 232 is electrically coupled to or included in the delivery circuit 230.

The delivery circuit 230 can include a logic gate that can provide selective switching between a charging circuit to charge the capacitor 220 and a provision circuit to provide electrical coupling to the analysis circuit 250. Stated otherwise, the logic gate of the delivery circuit 230 can control or direct delivery of electric current (induced in the wire 232) to either the capacitor 220 or to the analysis circuit 250. The logic gate of the delivery circuit 230 can respond (e.g., switch) based on a signal from the power management circuit 240. In other words, the fluctuating magnetic field produced by the current transformer 210 can induce an electromotive force in the wire 232, which can be propagated and directed or otherwise controlled by the delivery circuit 230 to provide either electrical energy (e.g., electric current) to the energy storage device 220 or electrical energy (e.g., voltage) to be analyzed by the analysis circuit 250.

The capacitor 220 can store electrical energy produced by the induced electromotive force within the wire 232. The capacitor 220 may store a quantity of energy that is fixed, can be represented by a constant, or otherwise understood to be a fixed or predictable amount. The capacitor 220 may be electrically coupled to and receive electric current from the delivery circuit 230 to store as energy. The capacitor 220, upon reaching a threshold level of energy storage, may release stored energy that can be used to power the analysis circuit 250.

The power management circuit 240 may control or otherwise direct, command, or instruct operation of the delivery circuit 230. The power management circuit 240 may include a relay (or other switch) to operate upon or at release of electrical energy from the capacitor 220. The relay may send a signal to the logic gate of the delivery circuit 230 to cause the logic gate to switch delivery of induced electric current between the capacitor 220 and the analysis circuit 250. Stated otherwise, the relay of the power management circuit 240, in a first position, causes completion of the power management circuit 240 to store energy in the capacitor 220 and, in a second position, causes completion of a circuit to direct induced current for analysis by the analysis circuit 250.

The power management circuit 240 may also control release of electrical energy from the capacitor 220 to power the analysis circuit 250.

The analysis circuit 250, in one embodiment, may be a processing circuit that can detect and/or measure electrical current in the monitored energy source 10. For example, the analysis circuit 250 may take a real-time sample or reading to determine a measurement of electric current in the monitored energy source 10. Specifically, the analysis circuit 250 may take a real-time sample or reading of voltage across the wire 232, such that current on the monitored energy source 10 over a period of time can be inferred. The current I can be inferred based on fundamental power equations:

$$P=I*V \quad \text{(Equation 1)}$$

$$I=P/V \quad \text{(Equation 2)}$$

The capacitor 220 may store a fixed, or otherwise predictable, amount of power (e.g., 90 milliwatts). A release of power from the capacitor 220 may indicate the amount of power stored by the capacitor 220 for a given period of time. A real-time voltage reading can then be used to infer current.

In other embodiments, the analysis circuit 250 may take a reading of current induced in the wire 232 by the monitored energy source 10.

As stated, the analysis circuit 250 may be powered by energy released from the capacitor 220. The analysis circuit 250 may be electrically coupled to the capacitor 220 and/or the power management circuit 240 to receive a release of energy from the capacitor 220.

The analysis circuit 250 may include one or more general purpose and/or special purpose processing devices, or other customized or programmable device. The analysis circuit 250 may run a standard operating system and perform standard operating system functions.

The analysis circuit 250 may include a network interface and/or wireless network interface to facilitate communication with other computing devices and/or networks, such as the Internet and/or other computing and/or communications networks and/or interfaces. The analysis circuit 250 may transmit (e.g., via a wireless protocol) information to an access node 12 (e.g., a wireless access point or other computing device), which may be coupled to a network 14

(e.g., the Internet). The transmission may include data indicating an ID (e.g., a Bluetooth ID, a device ID), and a measurement of the voltage and/or current in the monitored energy source 10. The transmission may be encrypted to aid in security. In turn, voltage and/or current in the monitored energy source 10 can be inferred and/or monitored (e.g., measured) remotely (e.g., from a remote operation center). Further, the measurement of the voltage and/or current can be processed remotely from the monitored energy source 10. Data concerning the voltage and/or current in the monitored energy source 10 can also be presented to a remote user, such as via an application on a mobile device 16.

The analysis circuit 250 may also receive (e.g., via a wireless protocol) information, such as from the network 14, by way of the access node 12. The received information may include instructions, software and/or firmware updates, settings, and the like. For example, the received information may include an update to a security protocol and/or security system.

The electricity current monitoring device 200 described above is advantageous in a number of respects. For example, the electricity current monitoring device 200 can measure current throughput in the monitored energy source 10 through a passive charging system. The electricity current monitoring device 200 harvests energy from the monitored energy source 10 to then sample or measure throughput of current in the monitored energy source 10.

Presently available current meters and devices and methods of measuring current operate only when powered on, such that when power is cut, or unavailable, the current meter cannot obtain a measurement.

By contrast, the present disclosure provides an analysis circuit 250 that can, in effect, continue to monitor electrical current in the monitored energy source 10 while not powered. The arrangement and operation of components of the disclosed electricity current monitoring device 200 enable unprecedented low power remote current monitoring.

Figure 3:
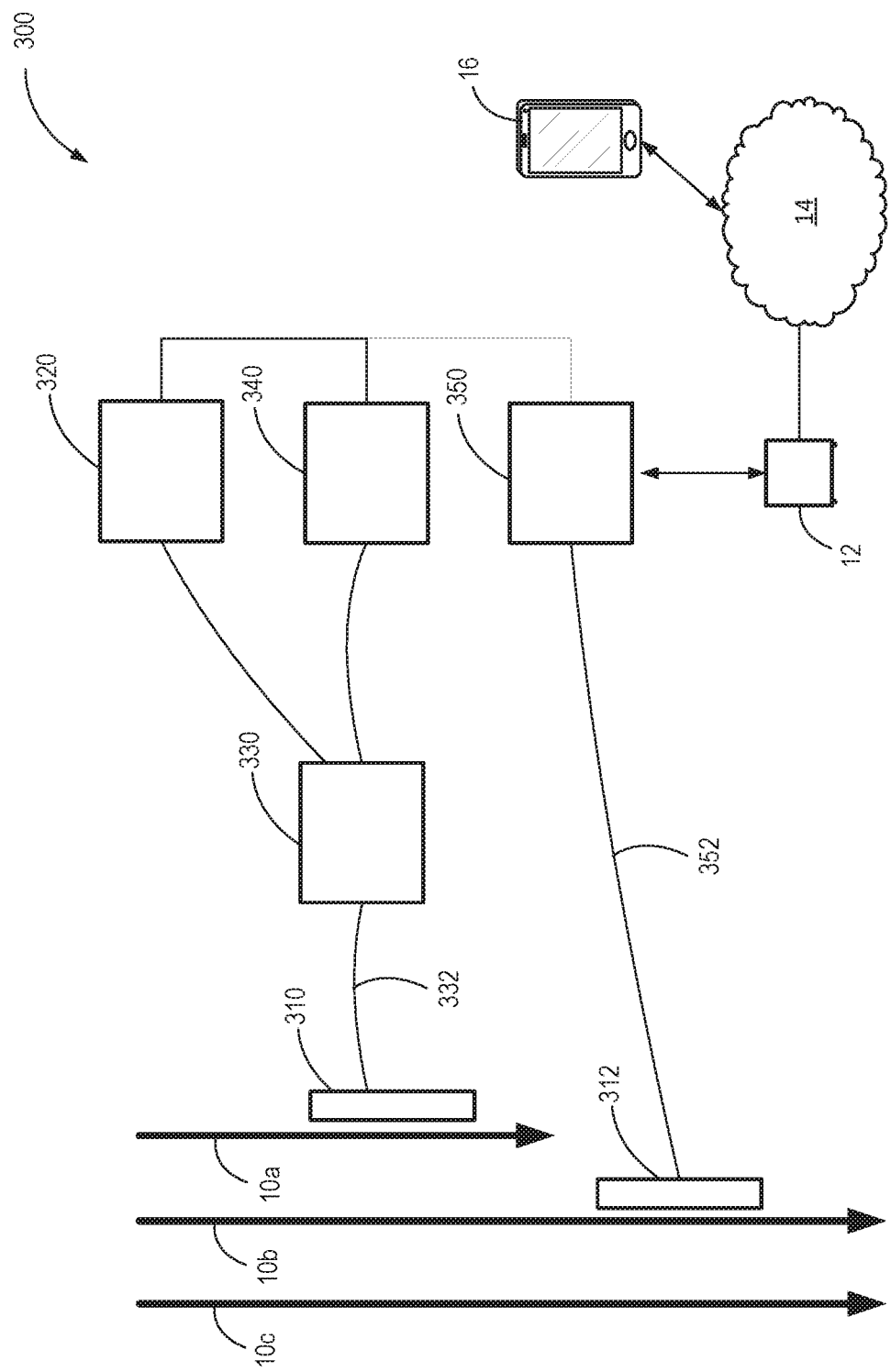
FIG. 3 is an electricity current monitoring device, according to another embodiment of the present disclosure.

FIG. 3 is an electricity current monitoring device 300, according to another embodiment of the present disclosure. The electricity current monitoring device 300 includes a first inductive energy transfer medium 310, a second inductive energy transfer medium 312, an energy storage device 320, delivery circuitry 330, power management circuitry 340, and processing circuitry 350. The electricity current monitoring device 300 is inductively powered based on current through a first electrical conductor 10a (e.g., a primary energy source) to monitor electricity current in a second electrical conductor 10b (e.g., a monitored energy source). The first electrical conductor 10a and the second electrical conductor 10b may be wires, such as in a three-phase power line to a building. In other embodiments, the first electrical conductor 10a and/or the second electrical conductor 10b may be a conductive panel or other type of electrical conductor.

The first inductive energy transfer medium 310 may be an inductive energy transfer electrical component, such as a current transformer. In another embodiment, the first inductive energy transfer medium 310 may be an inductive frequency panel. An electromotive force is induced in the first inductive energy transfer medium 310 by a fluctuating flow of electrical current in the first electrical conductor 10a. The electromotive force induced in the first inductive energy transfer medium 310 is conducted within a wire 332 of the delivery circuitry 330 to deliver electrical energy.

The delivery circuitry 330 can provide electrical coupling of the first inductive energy transfer medium 310 to the energy storage device 320. In other words, the fluctuating magnetic field produced by the first inductive energy transfer medium 310 in turn induces an electromotive force in the delivery circuitry 330 to provide electric current for delivery of electrical energy to the energy storage device 320.

The energy storage device 320 stores electrical energy produced by the induced electromotive force. In one embodiment, the energy storage device 320 may be a battery. In another embodiment, the energy storage device 320 may be a capacitor. The energy storage device 320 may store a quantity of energy that can be represented by a constant, or otherwise understood to be a fixed or predictable amount. The energy storage device 320, upon reaching a threshold level of energy storage, may release stored energy to the processing circuitry 350.

The power management circuitry 340 may control or otherwise direct storage of the electrical energy in the energy storage device 320. In some embodiments, the power management circuitry 340 may also control or otherwise direct a release of the electrical energy from the energy storage device 320. In one embodiment, the power management circuitry 340 may include a relay that electromechanically or electronically opens and closes an electrical circuit of the power management circuitry 340.

The second inductive energy transfer medium 312 may be a current transformer. In another embodiment, the second inductive energy transfer medium 312 may be an inductive frequency panel. The second inductive energy transfer medium 312 can produce a fluctuating magnetic field from a fluctuating flow of electrical current in the second electrical conductor 10b. The fluctuating magnetic field can induce an electromotive force within a wire 352 of the processing circuitry 350 to produce electrical energy that can be sampled, measured, or otherwise analyzed by the processing circuitry 350.

The processing circuitry 350, in one embodiment, can in real-time detect and/or measure electrical current in the second electrical conductor 10b. For example, the processing circuitry 350 may take a real-time sample or reading to measure electric current in the first electrical conductor 10a based on induction (e.g., a fluctuating magnetic field induced by the second inductive energy transfer medium 312), voltage, and/or a current in the wire 352. As stated earlier, the processing circuitry 350 may be powered by the energy released from the energy storage device 320 to perform the sampling, reading, and/or measuring operations, or to otherwise infer current in the second electrical conductor 10b. The processing circuitry 350 may be electrically coupled to the power management circuitry 340 to receive a release of energy from the energy storage device 320.

The processing circuitry 350 may include a network interface and/or wireless network interface to facilitate communication with other computing devices and/or networks, such as the Internet and/or other computing and/or communications networks. Specifically, the processing circuitry 350 may transmit (e.g., via a wireless protocol) information to an access node 12, which may in turn be coupled to a network 14 (e.g., the Internet). The transmission may include data indicating a measure of the current in the second electrical conductor 10b. In this manner, current in the second electrical conductor 10b can be monitored and/or measured remotely (e.g., from a remote operation center). Further, the measurements of the current can be processed remotely from the second electrical conductor 10b. Data concerning the current in the second electrical conductor 10b can also be presented to a remote user, such as via an application on a mobile device 16.

The processing circuitry 350 may also receive a transmission (e.g., via a wireless protocol) of information from the network 14 via the access node 12. The transmission may include instructions, software and/or firmware updates, settings, and the like.

In another embodiment, the processing circuitry 350 may simultaneously and/or independently monitor and/or measure the current in the first electrical conductor 10a. A transmission may include data indicating the measure of the current in the first electrical conductor 10a and the second electrical conductor 10b. The measurements of the current can be processed remotely from the first electrical conductor 10a and the second electrical conductor 10b. Data concerning the current in both the first electrical conductor 10a and the second electrical conductor 10b can also be presented to a remote user, such as via an application on a mobile device 16.

In another embodiment, another inductive energy transfer electrical component may be utilized in proximity to a third electrical conductor 10c for monitoring current in the third electrical conductor 10c.

In still another embodiment, the delivery circuitry 330 may electrically couple a plurality of inductive energy transfer electrical components to the processing circuitry 350 for monitoring. The delivery circuitry 330 may control sampling (or measuring) to alternate between the first electrical conductor 10a, the second electrical conductor 10b, and the third electrical conductor 10c. Any number of electrical conductors may be monitored in this manner.

As can be appreciated, in other embodiments, the processing circuitry 350 may perform operations to perform a variety of functions in addition to or other than detection and/or measurement of current in the first, second, and/or third electrical conductors 10a, 10b, 10c.

Figure 4:
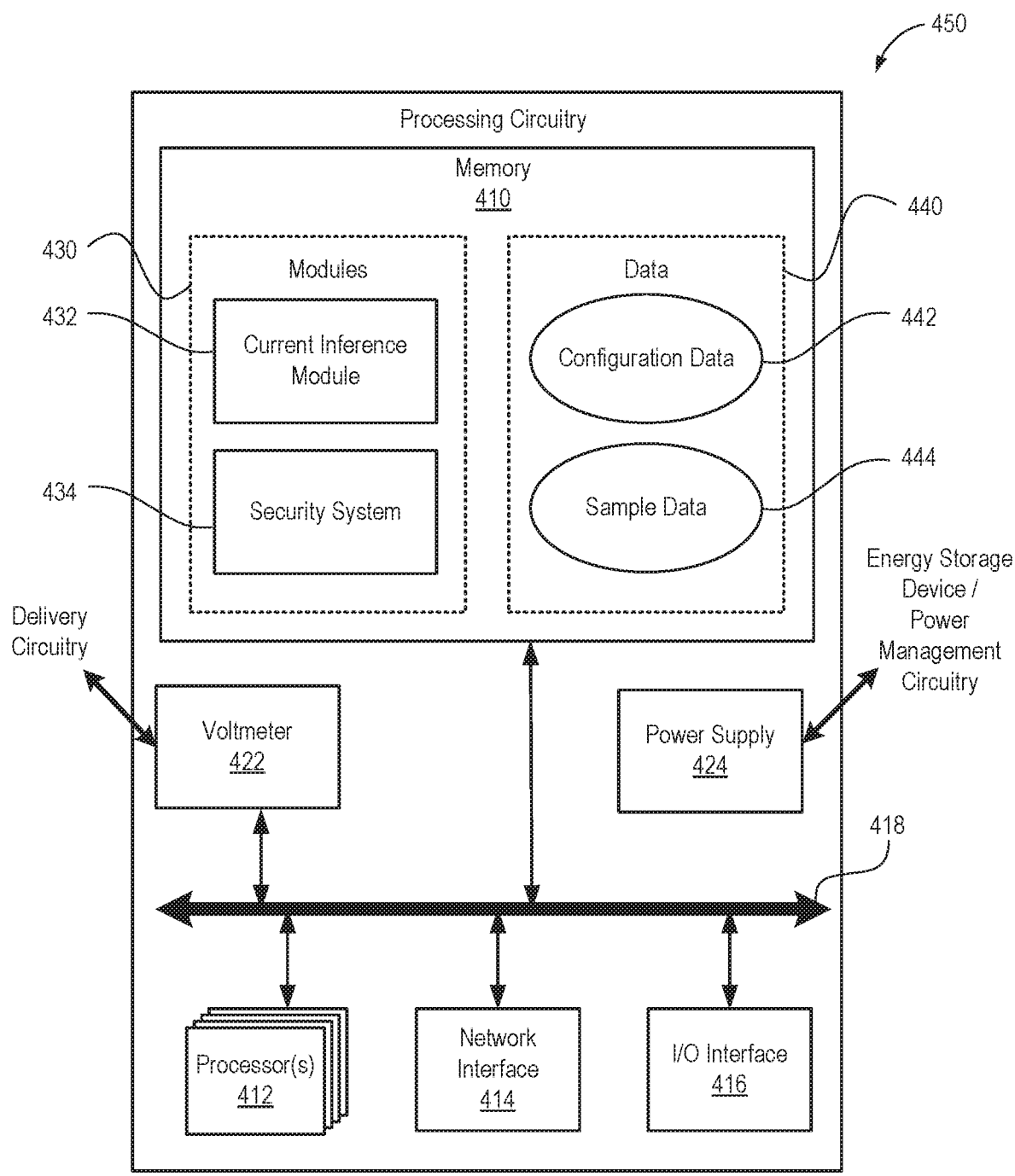
FIG. 4 is a block diagram of a processing circuit of an electricity current monitoring device, according to one embodiment.

FIG. 4 is a block diagram of processing circuitry 450 of an electricity current monitoring device, according to one embodiment of the present disclosure. The processing circuitry 450 may include electronic memory 410, one or more processors 412, a network interface 414, an I/O interface 416, a voltmeter 422, and a power supply 424.

The electronic memory 410 may include static RAM, dynamic RAM, flash memory, one or more flip-flops, or other electronic storage medium. The electronic memory 410 may include a plurality of modules 430 and data 440.

The modules 430 may include all or portions of other elements of the device. The modules 430 may run multiple operations serially, concurrently or in parallel by or on the one or more processors 412.

In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like.

The modules 430 may include a current inference module 432 and a security system 434. The current inference module 432 may, by the one or more processors 412, perform operations to infer a current through a monitored energy source, based on readings from other components, such as the voltmeter 422. The security system 434 may securely encrypt the data 440 transmitted (e.g., to the access node 12).

The data 440 stored on the electronic memory 410 may include data 440 generated by the processing circuitry 450, such as by the program modules 430 or other modules. The stored data 440 may be organized as one or more memory registers/addresses, files, and/or databases. The data 440 may include configuration data 442 and sample data 444. (e.g., a constant or formula specifying a threshold energy storage level, a capacity of an energy storage device, identification numbers, timestamps, quantities, volumes/intensities, and the like).

The one or more processors 412 may include any computing circuitry to perform operations to detect, measure, and/or infer a voltage or current within an energy source, based on inductance. The one or more processors 412 may include general purpose processors and/or special purpose processors. In one embodiment, the one or more processors 412 include a LoRa® chip and/or a Bluetooth® chip to provide special purpose transmit (Tx) and/or receive (Rx) functionality for communicating with other computing devices. These special purpose Tx/Rx chips may supplement and/or be included in the network interface 414.

The network interface 414 may facilitate communication with other computing devices and/or networks, such as the Internet and/or other computing and/or communications networks. The network interface 414 may be equipped with conventional network connectivity. The network interface 414 may be a wireless network interface, equipped with conventional wireless network connectivity technologies.

The I/O interface 416 may facilitate interfacing with one or more input devices and/or one or more output devices.

A system bus 418 may facilitate communication and/or interaction between the other components of the processing circuitry 450, including the electronic memory 410, the one or more processors 412, the network interface 414, the I/O interface 416, and the voltmeter 422.

The voltmeter 422 is coupled to delivery circuitry, or to an inductive energy transfer electrical component so as to measure a voltage across a circuit within which an electromotive force is induced via an inductive energy transfer electrical component. As described above, a fluctuating current within a monitored energy source can produce an electromagnetic field within an inductive energy transfer electrical component. The electromagnetic field in turn produces an electromotive force in a coupled circuit that causes current and/or voltage in the circuit. The voltmeter 422 can read or measure the voltage in the circuit. The measurement of the voltmeter 422 as to voltage in the circuit can be used (e.g., by the current inference module 432) to infer current in the monitored energy source.

The power supply 424 receives stored energy released from the energy storage device, for example, via power management circuitry. The power supply 424 may distribute received energy through the processing circuitry 450 to power the various components. Stated otherwise, at a receipt of energy, the power supply 424 powers up the processing circuitry 450.

As can be appreciated, in other embodiments, the processing circuitry 450 may be simpler than shown or described. For example, certain designs may forego one or more components, such as memory, multiple processors, multiple interfaces, and the like, and instead execute instructions closer to or on bare metal (e.g., without intervening operating system or other software layer, executing instructions directly on logic hardware).

Figure 5:
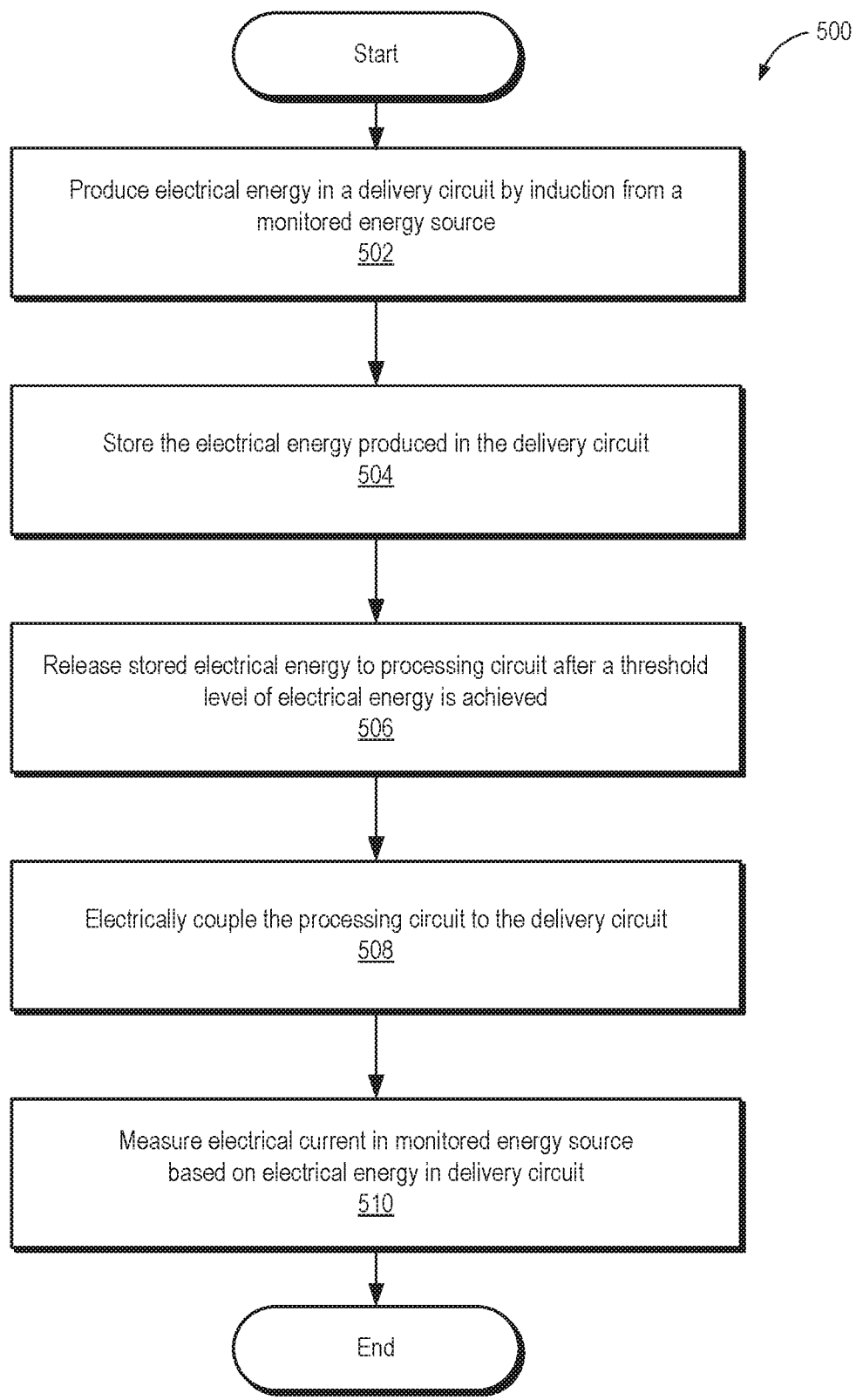
FIG. 5 is a flow diagram of a method of monitoring current in an energy source, according to one embodiment.

FIG. 5 is a flow diagram of a method 500 of monitoring current in an energy source, according to one embodiment. Electrical energy is produced 502, such as within a delivery circuit, by induction. For example, a current transformer may be used to produce electrical energy by driving an electromotive force in a delivery circuit. The current transformer may produce the electromotive force from a fluctuating magnetic field generated from a fluctuating flow of electrical current in a monitored energy source. The electrical energy that is produced 502 may be stored 504 in an energy storage device, such as a battery, a capacitor, or other energy storage device.

The electrical energy that is stored 504 may be released 506 from the energy storage device for use. For example, the electrical energy may be released 506 upon a predetermined threshold level of stored electrical energy being achieved. The electrical energy may be released 506 from the energy storage device to power a processing circuit.

The processing circuit may be electrically coupled 508 to a delivery circuit. Coupling 508 the delivery circuit and the processing circuit may enable or otherwise allow the processing circuit access to sample or measure a state of the monitored energy source, or an indication thereof. Specifically, one or more operations can be performed by the processing circuit, to detect and/or measure an electrical current in the monitored energy source, based on induction in the delivery circuit. The operations may include obtaining a measurement of a voltage within the delivery circuit, from which current in the monitored energy source can be inferred based on Ohm's Law and/or power equations.

Figure 6:
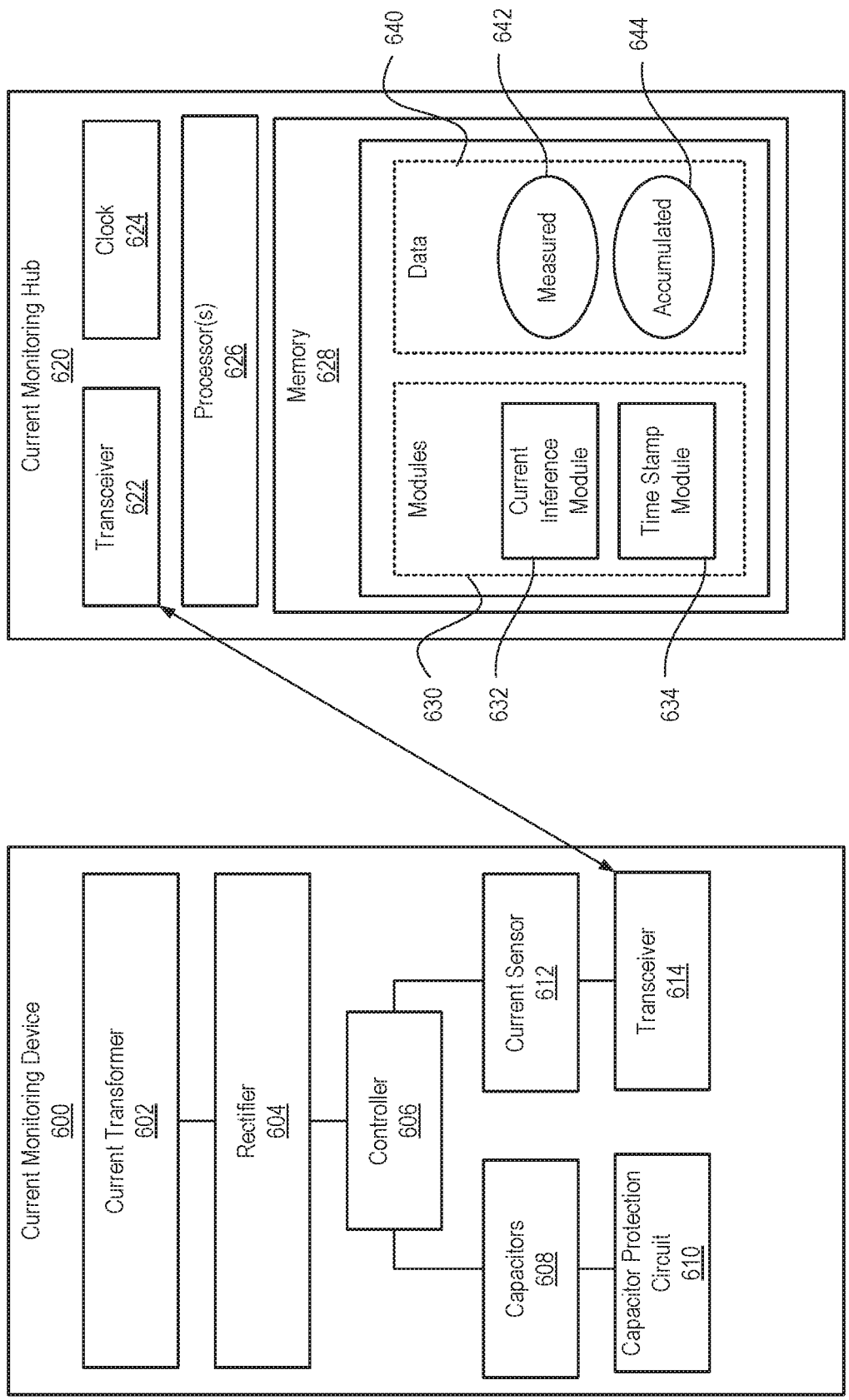
FIG. 6 is a block diagram of a current monitoring device and a current monitoring hub, according to one embodiment of the present disclosure.

FIG. 6 is a block diagram of a current monitoring device 600 and a current monitoring hub 620, according to one embodiments of the present disclosure. The current monitoring device 600 may measure current on an energy source and transmit the measured current to the current monitoring hub 620 for additional processing. The current monitoring hub 620 may be one embodiment of the other computing device 12 of FIG. 1.

The current monitoring device 600 may include a current transformer 602, a rectifier 604, a controller 606, capacitors 608, a capacitor protection circuit 610, a current sensor 612, and a transceiver 614. The current transformer 602 may produce an electrical current in the current monitoring device 600 due to a fluctuating magnetic field induced from a fluctuating flow of electrical current in a monitored energy source. The rectifier 604 may convert alternating current to direct current. The controller 606 directs the flow of electrical current between an energy storage device (e.g., capacitors 608), and the current sensor 612 and transceiver 614. The capacitor protection circuit 610 may protect the capacitors from over current and negative voltages.

The current monitoring device 600 may be self-powered. In other words, the electrical current induced in the current transformer 602 may provide elements of the current monitoring device 600 with power. For example, the current sensor 612 and transceiver 614 may use power to take current measurements, send a signal, and/or receive a signal. However, because the induced current relies on the flow of electrical current in the monitored energy source, there may not always be sufficient power available for the current sensor 612 and transceiver 614.

In some embodiments, the current monitoring device 600 may use intermittent monitoring and known energy storage capacities of the capacitors 608 to monitor current on the monitored energy source when the available power is unreliable. For example, the controller 606 may direct electrical current to the capacitors 608 until a predetermined threshold level of stored electrical energy is met. That threshold level of stored electrical energy may be enough for the current sensor 612 and transceivers 614 to accomplish current measurements and communication functions. In some embodiments, the predetermined threshold level is equivalent to the storage capacity of the capacitors 608. In these embodiments, the controller 606 may cause the capacitors to be filled and then direct the stored electrical energy from the capacitors to the current sensor 612 and the transceiver 614.

Thus, the current sensor 612 may measure the current intermittently. The intermittent measurements may provide some data points of electrical current. However, there will be time periods where the current sensor 612 is not provided power and will be unable to measure the current. During these periods when the current sensor 612 is in an off state, the current can be known based on the amount of current needed to charge the capacitors 608. Thus, the transceiver 614 may send the measured current and the predetermined threshold level to the current monitoring hub 620 to provide current data both while the current sensor 612 was operating (on-state) as well as while the capacitors 608 were charging (off-state). In some embodiments, the predetermined threshold may be known to the current monitoring hub 620. In some embodiments, the predetermined threshold may be transmitted to the current monitoring hub 620 by the current monitoring device 600.

The current monitoring hub 620 may comprise a transceiver 622, a clock 624, one or more processors 626, and memory 628. The current monitoring hub 620 may compile the current data to provide current monitoring for both the on-state and off-state of the current sensor 612. The transceiver 622 receives data from the current monitoring device 600. This data may include the measured current and the predetermined threshold value. The current monitoring hub 620 may receive data from one or more current monitoring devices.

The memory 628 may store data 640 including the measured current 642. The memory may further include modules 630 that when executed by the one or more processor(s) 626 causes the current monitoring hub to perform operations. The modules may include a time stamp module 634 and a current inference module 632. The time stamp module 634 may use the clock 624 to identify a reception time for any received current measurements.

Current inference module 632 may determine an off-state time period and a past electrical current that was in the monitored energy source while the energy storage device was storing electrical energy. For instance, to determine a length of the off-state time period, the current inference module 632 may compare the time stamps between received current measurements. To determine the past electrical current the current inference module 632 may use the predetermined threshold level. The resulting inferred off-state current may be stored as accumulated 644 current data.

In one embodiment, the current monitoring hub 620 may receive a first set of current monitoring parameters from an energy monitoring device for a first time period, the current monitoring parameters comprising measured current in a monitored energy source during the first time period. The current monitoring hub 620 may further receive a second set of current monitoring parameters from the energy monitoring device for a second time period, the current monitoring parameters comprising measured current in the monitored energy source during the second time period. The first time period and the second time period may be different, and there may be a third time period between the first time period and the second time period. To determine the past current that passed through the monitored energy source during the third time period, the monitoring hub 620 may consider an amount of current needed to power the energy monitoring device and the length of time between the first time period and the second time period.

A processor or processing device as used herein may include one or more general purpose devices, such as an ARM®, Intel®, AMD®, or other standard microprocessor, and/or one or more special purpose processing devices, such as ASIC, SoC, SiP, FPGA, PAL, PLA, FPLA, PLD, or other customized or programmable device. A processor or processing device can perform distributed (e.g., parallel) processing to execute or otherwise implement functionalities of the present embodiments. A processor or processing device may run a standard operating system and perform standard operating system functions.

Electronic memory as reference herein may include static RAM, dynamic RAM, flash memory, one or more flip-flops, ROM, CD-ROM, DVD, disk, tape, or magnetic, optical, or other computer storage medium. The electronic memory may include a plurality of program modules and/or a program data. The electronic memory may be local, or may be remote and/or distributed over a network.

An I/O interface as described herein may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

A network interface as described herein may facilitate communication with other computing devices and/or networks, such as the Internet and/or other computing and/or communications networks/devices. The network interface may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM), phone lines, modems in general, whether radio or wired. Further, the computer may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth.

A wireless network interface as described herein may be equipped with conventional wireless network connectivity technologies, such as, for example, Wireless Personal Area Network (WPAN) technologies (e.g., IrDA, Bluetooth, IEEE 802.15.4a (Zigbee), and IEEE 802.15.3c (UWB)), Wireless Local Area Network (WLAN) technologies (e.g., IEEE 802.11a/b/g (Wi-Fi), proprietary MIMO products, and IEEE 802.11n), Wireless Metropolitan Area Network (WMAN) technologies (e.g., IEEE 802.16 Broadband Wireless Access WMAN standard (WiMAX) and IEEE 802.20 (Mobile WiMAX)), and Wireless Wide Area Network (WWAN) technologies (e.g., LoRaWAN, GSM/GPRS/EDGE, CDMA2000, 1×RTT, UMTS/HSDPA, LTE, CDMA EV-DO Rev.0/A, HSUPA and EV-DO Rec.C, satellite, sonar/sound, Z-wave, Sigfox, LPWAN, and so forth).

As can be appreciated, other methods and processes are available and included in the descriptions above describing operation of the system embodiments and are within the scope of the present disclosure.

EXAMPLE EMBODIMENTS

Some examples of embodiments of induction powered electrical current monitoring are provided below.

Example 1

An electricity current monitoring device, comprising: an electrical component (e.g., an inductive energy transfer medium, such as a current transformer, an inductive frequency panel (like Qi)) in which a fluctuating magnetic field is induced from a fluctuating flow of electrical current in a monitored energy source (e.g., a wire), the fluctuating magnetic field to produce an electromotive force to produce electrical energy; an energy storage device (e.g. capacitor, battery) to store the electrical energy; power management circuitry to control storage of the electrical energy in the energy storage device and/or to control release of the electrical energy from the energy storage device; and processing circuitry to detect and measure the electrical current in the monitored energy source based on the fluctuating magnetic field generated by the electrical component, wherein the processing circuitry is electrically coupled to the power management circuitry to be powered using the electrical energy released from the energy storage device.

Example 2

The electricity current monitoring device of Example 1, further comprising: delivery circuitry to control or direct delivery of electric current to either the energy storage device or to the processing circuitry, wherein the fluctuating magnetic field produced by the electrical component induces the electromotive force in the delivery circuitry to provide electric current for delivery of electrical energy to the energy storage device.

Example 3

The electricity current monitoring device of Example 1, wherein the fluctuating flow of electrical current in the monitored energy source is alternating current (AC).

Example 4

The electricity current monitoring device of Example 1, wherein the fluctuating flow of electrical current in the monitored energy source is direct current (DC).

Example 5

An electricity current monitoring device, comprising: an electrical component in which a fluctuating magnetic field is induced from a fluctuating flow of electrical current in a monitored energy source, the fluctuating magnetic field to produce an electromotive force to provide electrical energy; an energy storage device to store a first portion of the electrical energy (and release the first portion of the electrical energy for use); power management circuitry to control storage of the first portion of electrical energy in the energy storage device (and release of the first portion of the electrical energy from the energy storage device); and processing circuitry to detect the electrical current in the monitored energy source based on a second portion of the electrical energy (provided by the electromotive force produced by the fluctuating magnetic field induced in the electrical component), wherein the processing circuitry is to be powered by the first portion of the electrical energy being released from the energy storage device.

Example 6

The electricity current monitoring device of Example 5, further comprising: delivery circuitry to control delivery of the first portion of the electrical energy to the energy storage device to be stored and delivery of the second portion of the electrical energy to the processing circuitry for detecting the electrical current in the monitored energy source.

Example 7

The electricity current monitoring device of Example 6, wherein the delivery circuitry comprises a gate to be switched by the power management circuitry at a transition from storing the first portion of the electrical energy in the energy storage device to releasing the first portion of the electrical energy from the energy storage device, wherein the gate switches delivery of the electrical energy from the energy storage device to the processing circuitry.

Example 8

The electricity current monitoring device of Example 5, wherein the power management circuitry comprises a relay that opens and closes one or both of the power management circuitry and the processing circuitry.

Example 9

The electricity current monitoring device of Example 8, wherein the relay, in a first position, closes the power management circuitry and opens the processing circuitry and, in a second position, opens the power management circuitry and closes the processing circuitry.

Example 10

The electricity current monitoring device of Example 5, wherein the processing circuitry is further to measure the electrical current in the monitored energy source based on the second portion of the electrical energy.

Example 11

The electricity current monitoring device of Example 5, wherein the fluctuating flow of the electrical current in the monitored energy source is alternating current (AC).

Example 12

The electricity current monitoring device of Example 5, wherein the fluctuating flow of the electrical current in the monitored energy source is direct current (DC).

Example 13

An inductively powered electricity current monitoring device, comprising: a current transformer (or other inductive energy transfer medium) in which a fluctuating magnetic field is induced from a fluctuating flow of electrical current in a monitored wire, the fluctuating magnetic field to produce an electromotive force to provide electrical energy; a capacitor electrically coupled to the current transformer to store electrical energy produced by the current transformer; a power management circuit (e.g., a relay or switch to a gate) to direct storage of electrical energy in the capacitor; and an analysis circuit to measure the electrical current in the monitored wire based on electrical energy provided by the electromotive force produced by the fluctuating magnetic field induced in the current transformer, wherein the analysis circuit is (electrically coupled to the power management circuit to be) powered using electrical energy released from the capacitor.

Example 14

An inductively powered device, comprising: an inductor (e.g., an inductive energy transfer medium) to be positioned in proximity to (e.g., not electrically coupled to) an energy source (e.g., a wire) in which a fluctuating magnetic field is induced by fluctuating electrical current within the energy source; an energy storage device (e.g. a capacitor, a battery) electrically coupled to the inductor to store electrical energy provided by an electromotive force produced from the fluctuating magnetic field induced in the inductor; a power management circuit electrically coupled to the energy storage device, the power management circuit to manage switching between storage of the electrical energy in the energy storage device and release of the electrical energy from the energy storage device; and a consumptive circuit electrically coupled to the power management circuit to operate using the electrical energy released from the energy storage device (e.g., upon the power management circuit switching to release the electrical energy from the energy storage device).

Example 15

A method for monitoring electricity current in an energy source, the method comprising: producing electrical energy within a delivery circuit by induction, including driving an electromotive force in the delivery circuit from a fluctuating magnetic field generated from a fluctuating flow of electrical current in a monitored energy source; storing the electrical energy in an energy storage device; upon a predetermined threshold level of stored electrical energy being met, releasing the electrical energy from the energy storage device to power a processing circuit; electrically coupling the delivery circuit to the processing circuit; and performing one or more operations by the processing circuit, including detecting and/or measuring the electrical current in the monitored energy source, based on induction in the delivery circuit.

Example 16

An electricity current monitoring device, comprising: an inductive energy transfer medium to be positioned in proximity to a primary energy source (e.g., a wire), the inductive energy transfer medium to produce an electromotive force in a delivery circuit to provide electrical energy (e.g., the electromotive force is induced by a fluctuating magnetic field from a fluctuating flow of electrical current in the primary energy source); an energy storage device to store the electrical energy; a power management circuit to control storage of the electrical energy in the energy storage device and to control release of the electrical energy from the energy storage device; and a processing circuit to detect and measure an electrical current in a monitored energy source based on the electromotive force in the delivery circuit, wherein the processing circuit may be electrically coupled to the power management circuit to be powered by the electrical energy released from the energy storage device.

Example 17

The electricity current monitoring device of Example 16, wherein the monitored energy source is the same as the primary energy source.

The foregoing specification has been described with reference to various embodiments. However, those skilled in the art appreciate that various modifications and changes can be made without departing from the scope of the present disclosure and the underlying principles of the invention. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

Example 18

An electricity current monitoring device, comprising: an electrical component in which a fluctuating magnetic field is induced from a fluctuating flow of electrical current in a monitored energy source, the fluctuating magnetic field to produce an electromotive force to provide electrical energy; an energy storage device to store a first portion of the electrical energy; power management circuitry to control storage of the first portion of electrical energy in the energy storage device; and processing circuitry to be powered by the first portion of the electrical energy being released from the energy storage device, the processing circuitry to: detect a present real-time electrical current in the monitored energy source based on a second portion of the electrical energy, and determine a past electrical current that was in the monitored energy source during storing of the first portion of the electrical energy in the energy storage device, the past electrical current based on the first portion of the electrical energy and a time elapsed between a previously detected real-time electrical current and the present real-time electrical current.

Example 19

The electricity current monitoring device of Example 18, further comprising: delivery circuitry to control delivery of the first portion of the electrical energy to the energy storage device to be stored and delivery of the second portion of the electrical energy to the processing circuitry for detecting the present real-time electrical current in the monitored energy source and determining the past electrical current that was in the monitored energy source.

Example 20

The electricity current monitoring device of Example 19, wherein the delivery circuitry comprises a gate to be switched by the power management circuitry at a transition from storing the first portion of the electrical energy in the energy storage device to releasing the first portion of the electrical energy from the energy storage device, and wherein the gate switches delivery of the electrical energy from the energy storage device to the processing circuitry.

Example 21

The electricity current monitoring device of Example 18, wherein the power management circuitry comprises a relay that opens and closes one or both of the power management circuitry and the processing circuitry.

Example 22

The electricity current monitoring device of Example 18, wherein the fluctuating flow of the electrical current in the monitored energy source is alternating current (AC).

Example 23

The electricity current monitoring device of Example 18, wherein the fluctuating flow of the electrical current in the monitored energy source is direct current (DC).

Example 24

An energy monitoring device, comprising: an inductor in which a fluctuating magnetic field is induced from a fluctuating flow of electrical current in a monitored wire, the fluctuating magnetic field to produce an electromotive force to provide electrical energy; an energy storage device coupled to the inductor to store electrical energy produced by the inductor; an analysis circuit to measure a real-time electrical current in the monitored wire when provided power by the energy storage device, wherein the energy storage device provides power to the analysis circuit when a predetermined threshold level of stored electrical energy is met; and a transmitter to send current monitoring parameters, wherein content and timing of the current monitoring parameters indicate electrical energy conducted on the monitored wire before the analysis circuit is provided power to measure the real-time electrical current and indicate electrical energy conducted on the monitored wire while the analysis circuit is provided power.

Example 25

The energy monitoring device of Example 24, wherein the energy storage device is a capacitor.

Example 26

The energy monitoring device of Example 24, further comprising a power management circuit electrically coupled to the energy storage device, the power management circuit to manage switching between storage of the electrical energy in the energy storage device and release of the electrical energy from the energy storage device.

Example 27

The energy monitoring device of Example 24, wherein the current monitoring parameters comprise a storage capacity of the energy storage device, and wherein the predetermined threshold level corresponds to the storage capacity.

Example 28

The energy monitoring device of Example 24, wherein the transmitter begins to send the current monitoring parameters when the predetermined threshold level of stored electrical energy is met and energy storage device provides power to the transmitter.

Example 29

A machine readable storage medium including machine-readable instructions which, when executed by one or more processors, are configured to cause the one or more processors to perform operations comprising: receiving a first set of current monitoring parameters from an energy monitoring device for a first time period, the current monitoring parameters comprising measured current in a monitored energy source during the first time period; receiving a second set of current monitoring parameters from the energy monitoring device for a second time period, the current monitoring parameters comprising measured current in the monitored energy source during the second time period, wherein the first time period and the second time period are different, and wherein there is a third time period between the first time period and the second time period; determining a past current that passed through the monitored energy source during the third time period based on an amount of current needed to reach a predetermined threshold.

Example 30

The machine readable storage medium of Example 29, further comprising: generating a first time stamp corresponding to the first set of current monitoring; generating a second time stamp corresponding to the second set of current monitoring; and determining a length of the third time period based on an amount of time elapsed between the first time stamp and the second time stamp.

Example 31

The machine readable storage medium of Example 29, further comprising receiving an energy storage capacity of the energy monitoring device.

Example 32

The machine readable storage medium of Example 31, wherein the predetermined threshold is a current needed to fill the energy storage capacity.

Example 33

The machine readable storage medium of Example 29, wherein the predetermined threshold is a current needed to power the energy monitoring device.

Example 34

The machine readable storage medium of Example 29, further comprising receiving current measurements on a second monitored energy source from a second energy monitoring device, and determining current on the second monitored energy source for time periods where current measurements are not available based on an amount of current required to power the second energy monitoring device.

Example 34

The machine readable storage medium of Example 34, wherein current monitoring parameters comprise an identification so the measured current in the monitored energy sources can be distinguished.

Example 35

A method for monitoring electricity current in an energy source, the method comprising: producing electrical energy within a delivery circuit by induction, including driving an electromotive force in the delivery circuit from a fluctuating magnetic field generated from a fluctuating flow of electrical current in a monitored energy source; storing the electrical energy in an energy storage device; upon a predetermined threshold level of stored electrical energy being met, releasing the electrical energy from the energy storage device to power a processing circuit; electrically coupling the delivery circuit to the processing circuit; and performing one or more operations by the processing circuit, including measuring real-time electrical current in the monitored energy source based on induction in the delivery circuit while the electrical energy from the energy storage device is powering the processing circuit, and inferring past electrical current that was in the monitored energy source when the electrical energy was being stored in the energy storage device, wherein the past electrical current is inferred based on the predetermined threshold and when the predetermined threshold level was met.

Example 36

The method of Example 35, wherein the past electrical current is inferred based on time between measurements and energy storage device capacity.

Example 37

An apparatus comprising: a transceiver to receive a first set of current monitoring parameters from an energy monitoring device for a first time period, the current monitoring parameters comprising measured current in a monitored energy source during the first time period and receive a second set of current monitoring parameters from the energy monitoring device for a second time period, the current monitoring parameters comprising measured current in the monitored energy source during the second time period, wherein the first time period and the second time period are different, and wherein there is a third time period between the first time period and the second time period; and a processor to determine a past current that passed through the monitored energy source during the third time period based on an amount of current needed to reach a predetermined threshold.

While the principles of this disclosure have been shown in various embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure.

Those having skill in the art will find apparent that changes may be made to the details of the above-described embodiments without departing from the underlying principles of the invention. Embodiments of the invention in which an exclusive property or privilege is claimed are defined as follows.

The invention claimed is:

1. An electricity current monitoring device, comprising:
an electrical component in which a fluctuating magnetic field is induced from a fluctuating flow of electrical current in a monitored energy source, the fluctuating magnetic field to produce an electromotive force to provide electrical energy;
an energy storage device to store a first portion of the electrical energy;
power management circuitry to control storage of the first portion of electrical energy in the energy storage device; and
processing circuitry to be powered by the first portion of the electrical energy being released from the energy storage device, the processing circuitry to:
detect a present real-time electrical current in the monitored energy source based on a second portion of the electrical energy, and
determine a past electrical current that was in the monitored energy source during storing of the first portion of the electrical energy in the energy storage device, the past electrical current based on the first portion of the electrical energy and a time elapsed between a previously detected real-time electrical current and the present real-time electrical current.

2. The electricity current monitoring device of claim 1, further comprising:
delivery circuitry to control delivery of the first portion of the electrical energy to the energy storage device to be stored and delivery of the second portion of the electrical energy to the processing circuitry for detecting the present real-time electrical current in the monitored energy source and determining the past electrical current that was in the monitored energy source.

3. The electricity current monitoring device of claim 2, wherein the delivery circuitry comprises a gate to be switched by the power management circuitry at a transition from storing the first portion of the electrical energy in the energy storage device to releasing the first portion of the electrical energy from the energy storage device, and
wherein the gate switches delivery of the electrical energy from the energy storage device to the processing circuitry.

4. The electricity current monitoring device of claim 1, wherein the power management circuitry comprises a relay that opens and closes one or both of the power management circuitry and the processing circuitry.

5. The electricity current monitoring device of claim 1, wherein the fluctuating flow of the electrical current in the monitored energy source is alternating current (AC).

6. The electricity current monitoring device of claim 1, wherein the fluctuating flow of the electrical current in the monitored energy source is direct current (DC).

7. An energy monitoring device, comprising:
an inductor in which a fluctuating magnetic field is induced from a fluctuating flow of electrical current in a monitored wire, the fluctuating magnetic field to produce an electromotive force to provide electrical energy;
an energy storage device coupled to the inductor to store electrical energy produced by the inductor;
an analysis circuit to measure a real-time electrical current in the monitored wire when provided power by the energy storage device, wherein the energy storage device provides power to the analysis circuit when a predetermined threshold level of stored electrical energy is met; and
a transmitter to send current monitoring parameters, wherein content and timing of the current monitoring parameters indicate electrical energy conducted on the monitored wire before the analysis circuit is provided power to measure the real-time electrical current and indicate electrical energy conducted on the monitored wire while the analysis circuit is provided power.

8. The energy monitoring device of claim 7, wherein the energy storage device is a capacitor.

9. The energy monitoring device of claim 7, further comprising a power management circuit electrically coupled to the energy storage device, the power management circuit to manage switching between storage of the electrical energy in the energy storage device and release of the electrical energy from the energy storage device.

10. The energy monitoring device of claim 7, wherein the current monitoring parameters comprise a storage capacity of the energy storage device, and wherein the predetermined threshold level corresponds to the storage capacity.

11. The energy monitoring device of claim 7, wherein the transmitter begins to send the current monitoring parameters when the predetermined threshold level of stored electrical energy is met and energy storage device provides power to the transmitter.

12. A non-transitory machine readable storage medium including machine-readable instructions which, when executed by one or more processors, are configured to cause the one or more processors to perform operations comprising:
receiving a first set of current monitoring parameters from an energy monitoring device for a first time period, the current monitoring parameters comprising measured current in a monitored energy source during the first time period;
receiving a second set of current monitoring parameters from the energy monitoring device for a second time period, the current monitoring parameters comprising measured current in the monitored energy source during the second time period, wherein the first time period and the second time period are different, and wherein there is a third time period between the first time period and the second time period;
determining a past current that passed through the monitored energy source during the third time period based on an amount of current needed to reach a predetermined threshold.

13. The non-transitory machine readable storage medium of claim 12, further comprising:
generating a first time stamp corresponding to the first set of current monitoring;
generating a second time stamp corresponding to the second set of current monitoring; and
determining a length of the third time period based on an amount of time elapsed between the first time stamp and the second time stamp.

14. The non-transitory machine readable storage medium of claim 12, further comprising receiving an energy storage capacity of the energy monitoring device.

15. The non-transitory machine readable storage medium of claim 14, wherein the predetermined threshold is a current needed to fill the energy storage capacity.

16. The non-transitory machine readable storage medium of claim 12, wherein the predetermined threshold is a current needed to power the energy monitoring device.

17. The non-transitory machine readable storage medium of claim 12, further comprising receiving current measurements on a second monitored energy source from a second energy monitoring device, and determining current on the second monitored energy source for time periods where current measurements are not available based on an amount of current required to power the second energy monitoring device.

18. The non-transitory machine readable storage medium of claim 17, wherein current monitoring parameters comprise an identification so the measured current in the monitored energy sources can be distinguished.

19. A method for monitoring electricity current in an energy source, the method comprising:
producing electrical energy within a delivery circuit by induction, including driving an electromotive force in the delivery circuit from a fluctuating magnetic field generated from a fluctuating flow of electrical current in a monitored energy source;
storing the electrical energy in an energy storage device;
upon a predetermined threshold level of stored electrical energy being met, releasing the electrical energy from the energy storage device to power a processing circuit;
electrically coupling the delivery circuit to the processing circuit; and
performing one or more operations by the processing circuit, including measuring real-time electrical current in the monitored energy source based on induction in the delivery circuit while the electrical energy from the energy storage device is powering the processing circuit, and
inferring past electrical current that was in the monitored energy source when the electrical energy was being stored in the energy storage device, wherein the past electrical current is inferred based on the predetermined threshold and when the predetermined threshold level was met.

20. The method of claim 19, wherein the past electrical current is inferred based on time between measurements and energy storage device capacity.

\* \* \* \* \*